(12) United States Patent
Ahmadloo

(10) Patent No.: US 10,725,076 B2
(45) Date of Patent: Jul. 28, 2020

(54) APPARATUS AND METHOD FOR MONITORING DIELECTRIC CONSTANT OF A SUBSTRATE

(71) Applicant: Veoneer US, Inc., Southfield, MI (US)

(72) Inventor: Majid Ahmadloo, Lowell, MA (US)

(73) Assignee: Veoneer US, Inc., Southfield, MI (US)

( * ) Notice: Subject to any disclaimer, the term of this patent is extended or adjusted under 35 U.S.C. 154(b) by 82 days.

(21) Appl. No.: 16/184,331

(22) Filed: Nov. 8, 2018

(65) Prior Publication Data

US 2020/0150167 A1 May 14, 2020

(51) Int. Cl.
*G01R 27/26* (2006.01)
(52) U.S. Cl.
CPC .............................. *G01R 27/2623* (2013.01)
(58) Field of Classification Search
CPC ............ G01R 27/2623; G01R 27/2617; G01R 31/00; G01R 23/00; G01R 23/16; G01R 23/18; G01R 27/28; G01R 31/2822; G01R 31/31708; G01R 27/06; G01R 31/11; G01R 27/30; G01N 22/00
USPC ...................... 324/612, 76.19, 637, 642, 646
See application file for complete search history.

(56) References Cited

U.S. PATENT DOCUMENTS

| 9,151,793 B1* | 10/2015 | Hassan | G01R 27/2682 |
| 2005/0150278 A1* | 7/2005 | Troxler | G01N 22/00 |
| | | | 73/78 |
| 2011/0260925 A1* | 10/2011 | Chirila | H01Q 1/38 |
| | | | 343/700 MS |
| 2014/0361791 A1* | 12/2014 | Park | G01R 27/2658 |
| | | | 324/636 |
| 2017/0059492 A1* | 3/2017 | Karimi | G01N 33/2823 |

FOREIGN PATENT DOCUMENTS

CN  103913641 A  7/2014
CN  205179485 U  4/2016

* cited by examiner

*Primary Examiner* — Judy Nguyen
*Assistant Examiner* — Robert P Alejnikov, Jr.
(74) *Attorney, Agent, or Firm* — Burns & Levinson LLP; Steven M. Mills

(57) ABSTRACT

A system for monitoring dielectric constant of a substrate includes a resonator structure formed on a surface of the substrate. A distal end of a waveguide is coupled to the resonator structure and spaced apart from the resonator structure such that a gap is provided between the distal end of the waveguide and the resonator structure. An excitation energy is coupled to the resonator structure out of the waveguide, and a response energy from the resonator structure is coupled into the waveguide and is detected at a proximal end of the waveguide. A detector detects the response energy received at the proximal end of the waveguide and generates a signal indicative of the detected response energy. A processor is coupled to the detector for receiving the signal indicative of the detected response energy and processing the signal to determine dielectric constant of the substrate.

21 Claims, 9 Drawing Sheets

APPARATUS AND METHOD FOR MONITORING DIELECTRIC CONSTANT OF A SUBSTRATE

BACKGROUND

1. Technical Field

The present disclosure is related to radio frequency (RF) systems and, more particularly, to a system and method for monitoring dielectric constant of a printed circuit board on which one or more RF components and/or subsystems are mounted.

2. Discussion of Related Art

In RF systems, it is important to monitor the dielectric constant characteristics of the RF substrates used in high-frequency applications, including, for example, 77 GHz radar systems. Many such RF substrates have not been thoroughly characterized at such frequencies, and, due to manufacturing or processing tolerances, can vary in their center values, which can significantly affect the performance of antennas and the RF front end. Currently used resonators or transmission lines require sensitive ground-signal-ground (GSG) probing devices, which limit their application due to cost and time required to perform such sensitive probing measurements.

SUMMARY

According to a first aspect, a system for monitoring dielectric constant of a substrate is provided. The system includes a resonator structure formed on a surface of the substrate. A distal end of a waveguide is coupled to the resonator structure and spaced apart from the resonator structure such that a gap is provided between the distal end of the waveguide and the resonator structure. An excitation energy is coupled to the resonator structure out of the waveguide, and a response energy from the resonator structure is coupled into the waveguide and is detected at a proximal end of the waveguide. A detector detects the response energy received at the proximal end of the waveguide and generates a signal indicative of the detected response energy. A processor is coupled to the detector for receiving the signal indicative of the detected response energy and processing the signal to determine dielectric constant of the substrate.

In some exemplary embodiments, the waveguide is an open-ended waveguide.

In some exemplary embodiments, the detector comprises a network analyzer. The processor can include at least a portion of the network analyzer. The network analyzer can be a vector network analyzer.

In some exemplary embodiments, the excitation energy has a nominal frequency of approximately 77 GHz. In some exemplary embodiments, the excitation energy has a frequency in a range of 60 to 90 GHz. In some exemplary embodiments, the excitation energy has a nominal frequency of approximately 24 GHz.

In some exemplary embodiments, the processor performs a resonance behavior analysis of return loss patterns received back at the detector to determine dielectric constant of the substrate.

In some exemplary embodiments, the calibration comprises a vector network analyzer (VNA) calibration.

In some exemplary embodiments, wherein the resonator structure comprises a split-ring resonator structure. The split-ring resonator can be tuned to a frequency of the excitation energy.

In some exemplary embodiments, the resonator structure comprises a coupon structure.

In some exemplary embodiments, the substrate is populated with at least one electronic element. Alternatively, the substrate can be a bare unpopulated substrate.

In some exemplary embodiments, the waveguide is selected based on a desired frequency band.

In some exemplary embodiments, a configuration of the split-ring resonator is selected based on a desired frequency band and in accordance with material properties of the substrate.

In some exemplary embodiments, a location of the split-ring resonator on the substrate is selected based on location of at least one electronic component mounted on the substrate.

According to another aspect, a method for monitoring dielectric constant of a substrate is provided. The method includes: forming a resonator structure on a surface of the substrate; coupling a distal end of a waveguide to the resonator structure, the distal end of the waveguide being spaced apart from the resonator structure such that a gap is provided between the distal end of the waveguide and the resonator structure; coupling an excitation energy to the resonator structure out of the distal end of the waveguide; detecting a response energy from the resonator structure at a proximal end of the waveguide; generating a signal indicative of the detected response energy; and processing the signal indicative of the detected response energy to determine dielectric constant of the substrate.

In some exemplary embodiments, the detector comprises a vector network analyzer. In some exemplary embodiments, the processor comprises at least a portion of a vector network analyzer.

In some exemplary embodiments, the excitation energy has a frequency in a range of 60 to 90 GHz.

In some exemplary embodiments, processing the signal indicative of the detected response energy comprises performing a resonance behavior analysis of return loss patterns received back at the detector to determine dielectric constant of the substrate.

According to another aspect, a circuit board for use in a radio frequency (RF) system is provided. The circuit board includes a substrate and a split-ring resonator structure formed on the substrate. The split-ring resonator structure is adapted to be excited by excitation energy from a distal open end of a waveguide and provide response energy back into the distal open end of the waveguide, the response energy being detectable to provide a measurement of dielectric constant of the substrate when the distal end of the waveguide is located in proximity to the split-ring resonator structure and spaced apart from the split-ring resonator structure and not contacting the split-ring resonator structure.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION

Figure 1A:
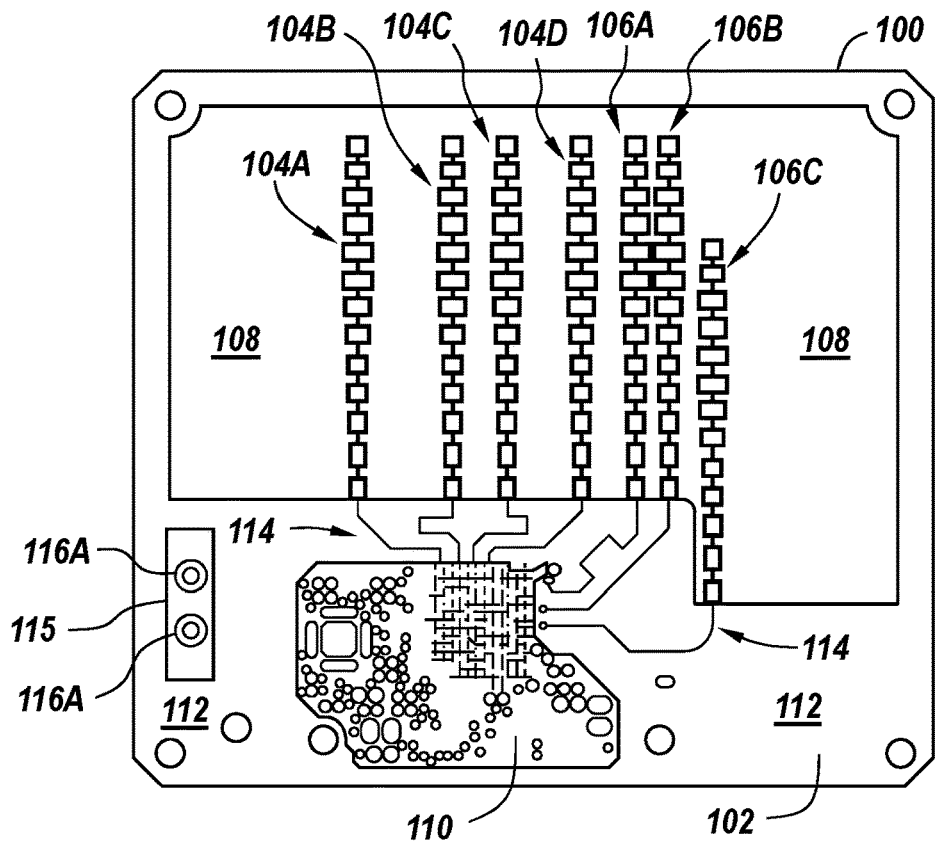
FIG. 1A includes a schematic top view of a printed circuit board (RF board) in which the dielectric constant measuring and monitoring technique of the present disclosure can be implemented, according to some exemplary embodiments.

According to the present disclosure, one or more metallic or otherwise conductive patterns, such as, for example, split ring resonator patterns, are formed on every manufactured board. This configuration utilizes the distinct return loss features due to interaction of the metallic part of the rings with the substrate to characterize the dielectric constant of the substrate and monitor variations in dielectric constant from board to board. In the configuration of the disclosure, an open-ended waveguide, e.g., a WR12 waveguide, is used to capture the return loss response of the ring. In this particular exemplary embodiment, a WR12 waveguide is selected because it is suited for use at a particular frequency range of interest, for example, 76-77 GHz band. It will be understood that in other frequency ranges, other waveguides may be used.

According to the present disclosure, the split-ring resonators are excited by being exposed to the open end of the waveguide, e.g., the WR12 waveguide. The interaction of exciting electromagnetic (EM) fields with the split-ring resonators and the substrate material affects the EM fields at the open end of the waveguide located in proximity to the split-ring resonators and, as a result, changes the return loss pattern of the waveguide. According to the disclosure, this variation in the resonance response is used as a signature of the substrate material to determine its dielectric constant value.

Placement of transmission lines and ring resonators and other test coupons for dielectric constant monitoring purposes is common practice. However, these conventional systems require high-precision, high-frequency contact probing. Probe stations are extremely costly and time consuming to calibrate and operate, and also require trained, patient operators to conduct reasonably consistent measurements and collet required data. The ground-signal-ground (GSG) pin configuration tip on the probes at a frequency of around 77 GHz, for example, are also extremely fragile and have a limited lifetime, and can only be used for a limited number of placements on the sample pads before becoming damaged, requiring expensive re-tuning or replacement altogether. This conventional technique is typically useful for testing a relatively small number of samples and cannot be effectively utilized for a large number of samples, and, certainly is not applicable for testing every board in a fabrication panel, as is typically required in production manufacturing environments.

Furthermore, in these conventional systems, the board must be placed under the probes such that clearance on the board is provided. Components on the board should be placed in a way that does not obstruct the movement of the probe tips and the entire probe holding section, as the movement is only possible at straight angles and hence limits the orientation of test coupons in relation to the components on the board and setup in the probe station. While placing test coupons in different orientations is possible, it significantly increases the test time as the entire probing setup should be reoriented for the measurements.

The present disclosure provides an alternative technique to overcome the drawbacks of probing by eliminating the physical touch of the probe. In some exemplary embodiments, this is achieved by utilizing the close proximity coupling of a regular open-ended E-band waveguide and specially-tuned 77 GHz, for example, split ring resonators formed on the board being monitored. The rings have a very small footprint and occupy minimal space on the board, and can be coupled to the waveguide end with no physical touch. In exemplary embodiments, the calibration process is the single-port vector network analyzer (VNA) process, and the entire process of calibration and data collection can be completed in less than one minute, in contrast with several hours being required to carry out a conventional probing technique.

Another drawback of conventional probing techniques overcome according to the present disclosure is in the potential need to place calibration structures on boards which may be subject to etching and fabrication tolerances. Applying a conventional VNA calibration kit as set forth in accordance with the present disclosure greatly reduces the complexity of the data processing resulting from variable calibration. Hence, the technique of the present disclosure significantly increases consistency of measured data from panel to panel, which can be maintained over different rounds of manufacturing lots over a long span of time.

Hence, according to the present disclosure, tuned split rings with a small footprint, in contrast with conventional structures, are used. Their interaction with substrate or board material can be measured and monitored utilizing a standard open-ended waveguide. The technique of the disclosure provides equal or superior accuracy and precision when compared to conventional probing techniques, which significantly reducing the cost and time required for measurements. Also, the structure of the present disclosure is less prone to tolerance effects of fabrication processes and etching, since the conventional resonator couplings and repeatabilities are sensitive to the small GSG gap size variations and placement of pins.

FIG. 1A includes a schematic top view of a printed circuit board 100 in which the dielectric constant measuring and monitoring technique of the present disclosure can be implemented, according to some exemplary embodiments. Referring to FIG. 1A, substrate 102 has formed thereon multiple, e.g., four, receive antenna patch arrays 104A, 104B, 104C, 104D and three Tx antenna patch arrays 106A, 106B, 106C, formed in a first region 108 of substrate 102. Associated circuitry 110, which can include, for example, electronic components, such as digital components such as processors, memories, integrated circuits, amplifiers, busses, as well as individual passive electronic components, e.g., resistors, capacitors, etc., can be mounted in a second region 112 of substrate 102. Microstrip lines 114, which connects associated circuitry 110 with antenna patch arrays 104A, 104B, 104C, 104D, 106A, 106B, 106C, can also be formed in second region 112 of substrate 102.

Figure 1B:
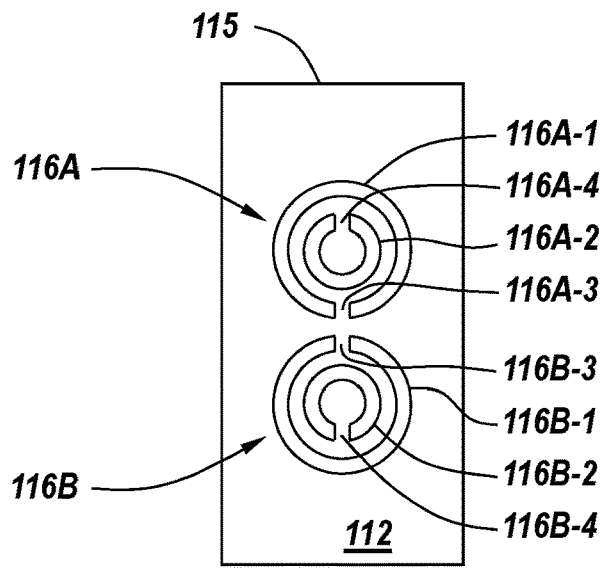
FIG. 1B includes a schematic detailed top view a region of FIG. 1A, showing in detail the split-ring resonator structure of the disclosure, according to some exemplary embodiments.

Continuing to refer to FIG. 1A, one or more split ring resonator structures 116A and 116B are formed in region 115 of substrate 102. FIG. 1B includes a schematic detailed top view of region 115 of FIG. 1A, showing in detail the split ring resonator structures 116A and 116B of the disclosure, according to some exemplary embodiments. According to the exemplary embodiments, split-ring resonator structures can be used individually, in pairs as illustrated in the exemplary embodiments of FIGS. 1A and 1B, and in other group sizes. A pair of split-ring resonator structures can be used to increase the layers of resonance data and improve the quality of post-processed data to interpret the dielectric constant value of the substrate more accurately.

In the illustrated exemplary embodiment, split-ring resonator structure 116A includes an outer split ring 116A-1 having a split gap 116A-3 and an inner split ring 116A-2 having a split gap 116A-4. Similarly, split-ring resonator structure 116B includes an outer split ring 116B-1 having a split gap 116B-3 and an inner split ring 116B-2 having a split gap 116B-4. The rings are formed as shown on the surface of substrate 112 by any deposition technique used for forming conductive elements on substrates, such as metallic sputtering or the like. The split metal strips of split-ring resonator structures 116A and 116B provide inductance L and capacitance C combined in a single structure which acts a resonance circuit, the resonant frequency of which is tightly related to the material properties of the substrate on which they are disposed. In the configuration to which the present disclosure is directed, exemplified by the embodiment illustrated in FIG. 1B, split rings 116A-1, 116A-2 and 116B-1, 116B-2 act as an LC resonator excited by the energy coupled into them by interaction with the open end of the waveguide. The resonance response is used according to the present disclosure as an indicator of the dielectric constant value of the substrate material. According to the present disclosure, the length of the rings, the width of the strips and the sizes of the split gaps are optimized to provide resonance behavior with the desired frequency band in which the system is designed to operate, which in some particular exemplary embodiments is 76-77 GHz, i.e., the band utilized for automotive radar systems, which is an important application for the subject of the present disclosure.

Figure 2A:
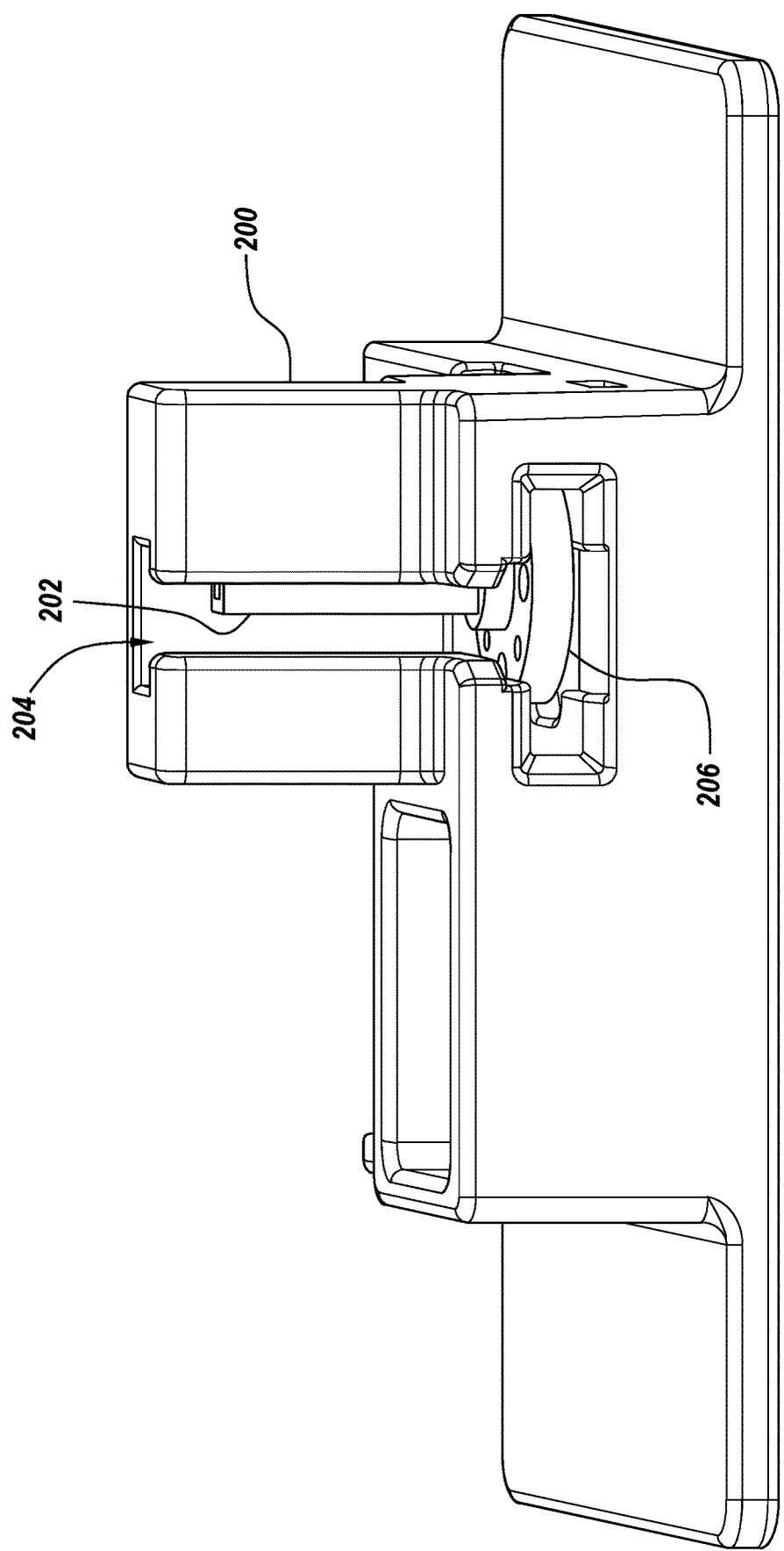
FIGS. 2A and 2B include schematic perspective views of a test fixture in which an RF board can be positioned for dielectric constant measuring/monitoring, according to some exemplary embodiments. Specifically, FIG. 2A includes a schematic perspective rear view of the test fixture without an RF board placed therein, and FIG. 2B includes a schematic perspective front view of the test fixture with RF board 100 placed in position for testing in fixture 200, according to some exemplary embodiments.
Figure 2B:
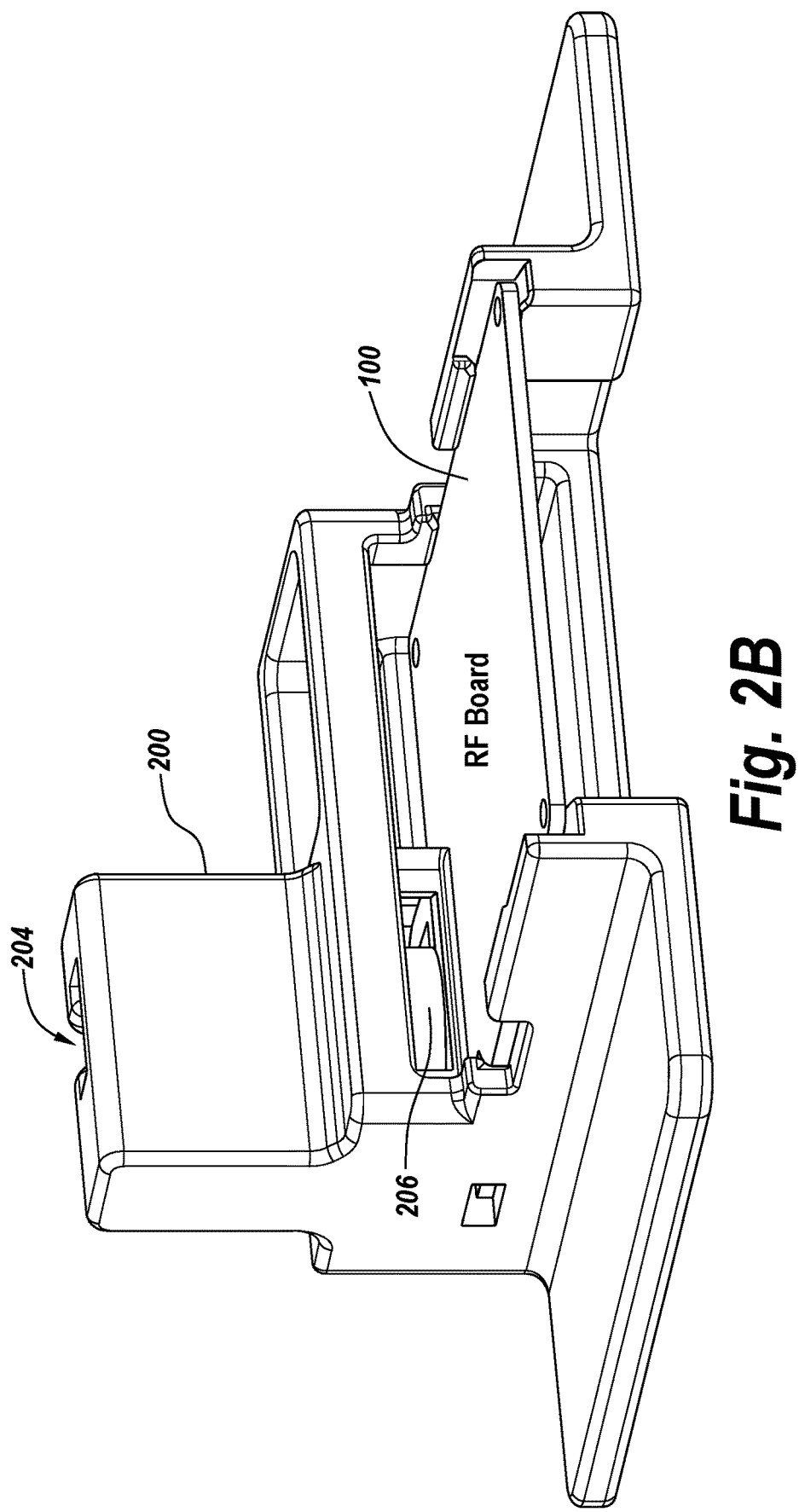
Figure 2C:
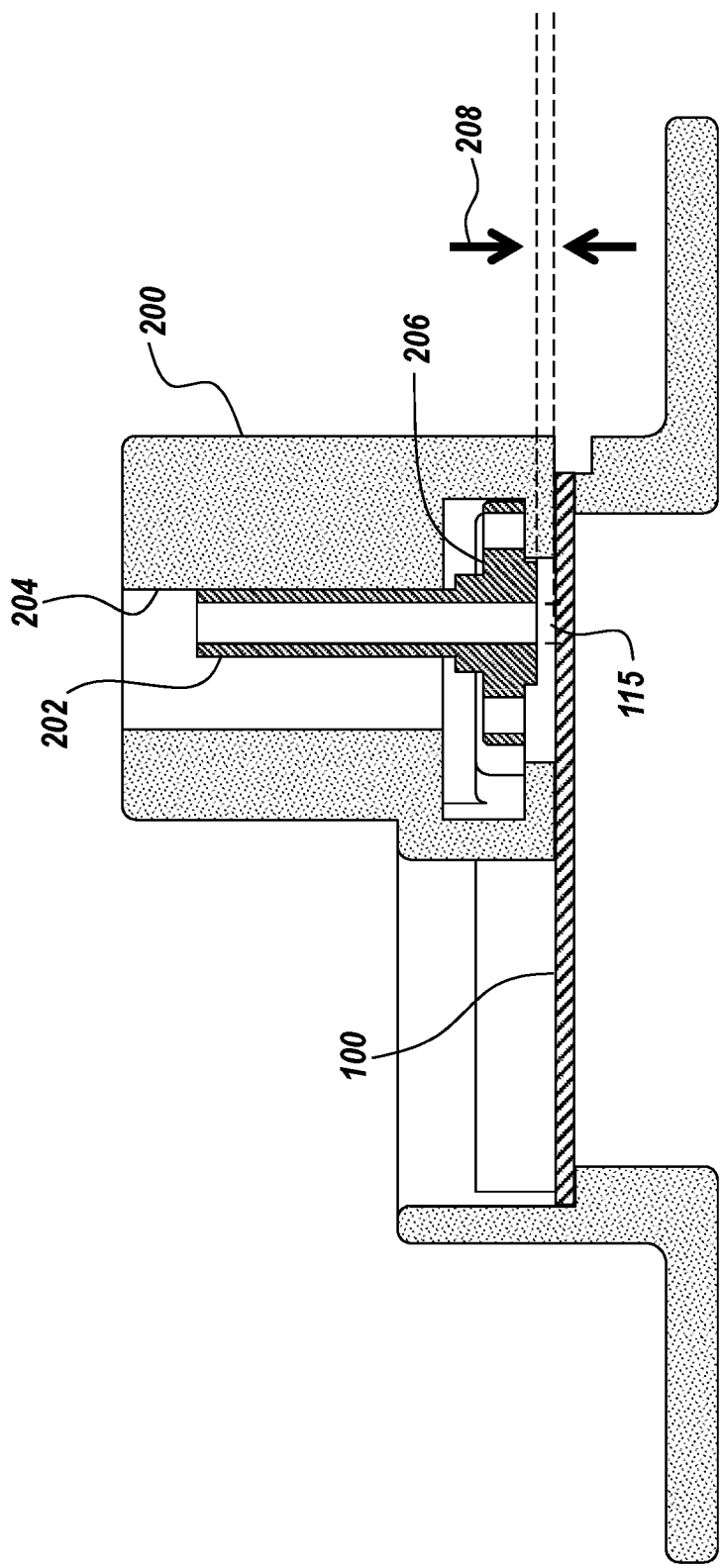
FIG. 2C includes a schematic cross-sectional view of an RF board positioned within a test fixture for dielectric constant measurement/monitoring, according to some exemplary embodiments.
Figure 2D:
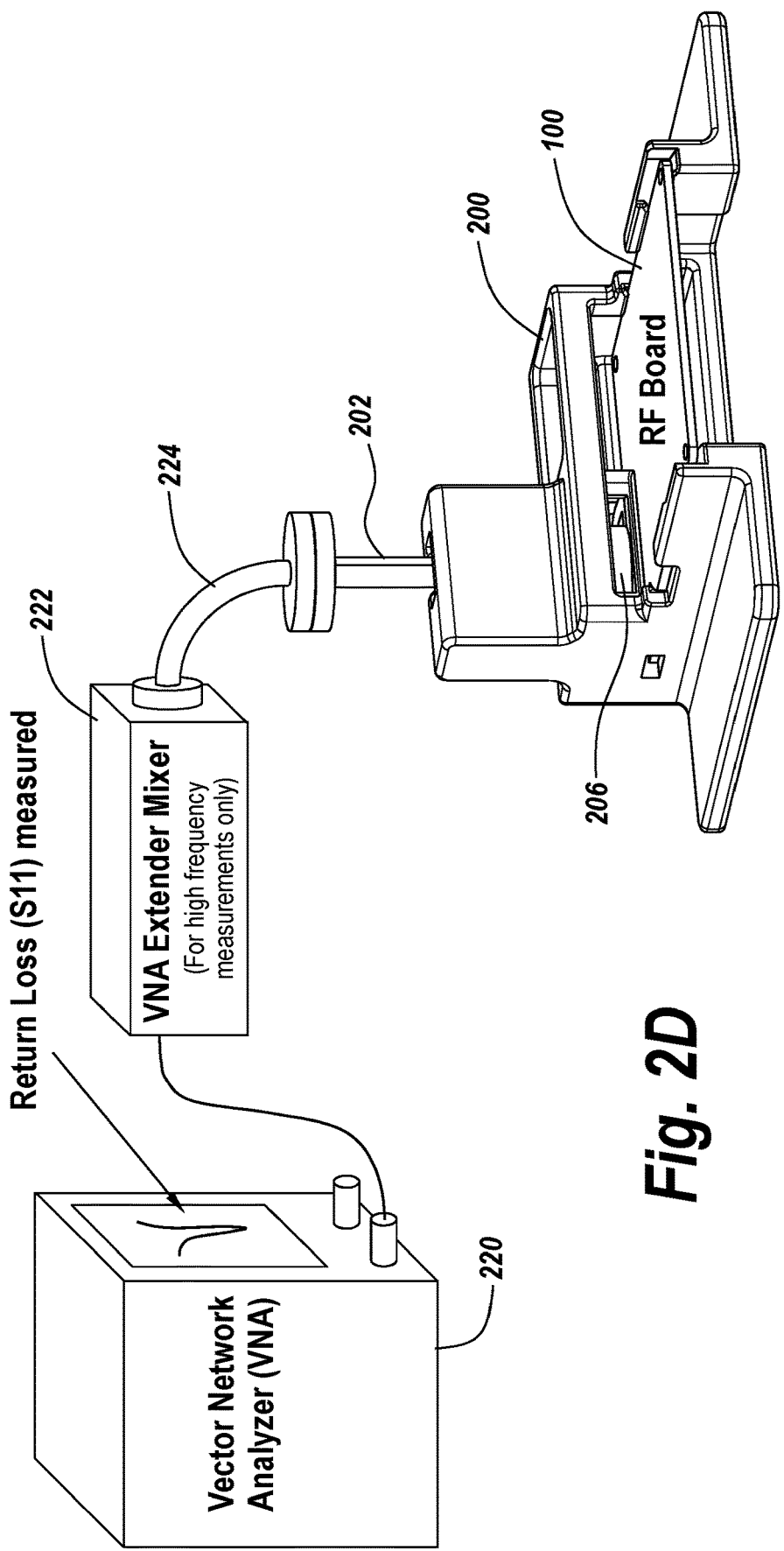
FIG. 2D includes a schematic diagram of a system for measuring/monitoring dielectric constant of an RF board, according to some exemplary embodiments.

According to the present disclosure, the technique of measuring/monitoring dielectric constant of RF boards includes insertion or placement of the boards in a fixture designed for the measurement. FIGS. 2A and 2B include schematic perspective views of a test fixture 200 in which RF board 100 can be positioned for the dielectric constant measuring/monitoring of the present disclosure. Specifically, FIG. 2A includes a schematic perspective rear view of fixture 200 without RF board 100 placed therein, and FIG. 2B includes a schematic perspective front view of fixture 200 with RF board 100 placed in position for testing in fixture 200. FIG. 2C includes a schematic cross-sectional view of RF board 100 positioned within fixture 200 for dielectric constant monitoring, according to some exemplary embodiments. FIG. 2D includes a schematic diagram of a system for measuring/monitoring dielectric constant of an RF board, according to some exemplary embodiments.

Referring to FIGS. 2A through 2D, RF board 100 includes region 115 including one or more split ring resonator structures 116A and 116B according to the exemplary embodiments, as described in detail above. Region 115 is positioned below and spaced apart from waveguide flange rings 206 mounted within fixture 200. Gap 208 provided between waveguide flange 206 and split ring resonator region 115 provides the contactless dielectric constant measurement of the present disclosure.

In exemplary embodiments, open-ended waveguide 202 passes through opening 204 to couple the testing fixture 200 to a network analyzer, such as a vector network analyzer (VNA) 220, via a connecting waveguide 224 and an optional VNA extender mixer 222, used for high-frequency measurements. Open-ended waveguide 202 can be, for example, a WR12 waveguide for the frequency range of interest. In some exemplary embodiments, the system is designed to operate in the E-band, i.e., approximately 60-90 GHz, and nominally at a frequency of approximately 77 GHz. It will be understood that other waveguides can be used for measurements both within and outside the frequency range of interest. Also, the system can operate in other frequency ranges and at other absolute frequencies, such as, for example, a frequency range including a nominal frequency of 24 GHz. As described above, fixture 200 maintains gap 208 between the open end of waveguide 202 and the split-ring resonators 116A, 116B on RF board 100 to provide proper electromagnetic coupling between them.

Split-ring structures 116A, 116B are excited by the guided wave propagating from VNA 220 through optional VNA extender mixer 222 and waveguides 224 and 202, and change the signal properties of the electromagnetic wave reflected back into waveguide 202 toward VNA 220 where return loss (S11) is measured. This can be measured in the change in scattering parameters at VNA 220. VNA 220 includes a processor for processing the returning signals according to the technique described herein in detail.

Figure 3:
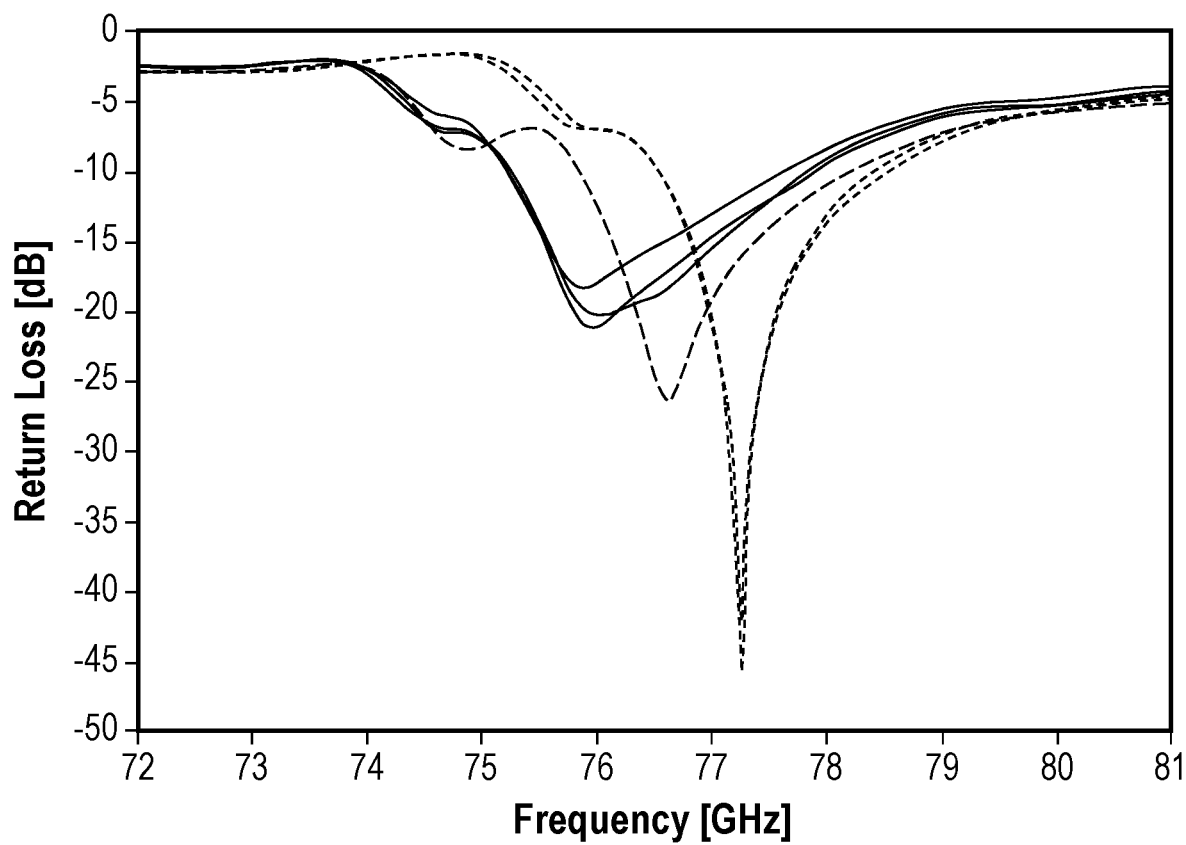
FIG. 3 includes resonance graphs illustrating the measured waveguide scattering parameter (return loss) in dB versus frequency in GHz, according to some exemplary embodiments.

FIG. 3 includes resonance graphs or plots illustrating the measured waveguide scattering parameter (return loss) in dB versus frequency in GHz, according to some exemplary embodiments. FIG. 3 provides a return loss plot in which the amplitude of the S11 signal is plotted versus frequency. Return loss is measured in correspondence to the split ring resonators 116A, 116B excited by the waveguide modes. Referring to FIG. 3, the resonance effect and location of a sharp valley is tightly related to dielectric properties of the RF substrate of RF board 100 on which split-ring resonator structures 116A, 116B are formed. The exact location in frequency of such resonance responses correlates directly to the effective dielectric constant of the substrate on which split-ring resonator structures 116A, 116B are fabricated. Measured scattering parameters of the waveguide at the VNA 220 can be rapidly processed by a mathematical model to associate the response resonance curves to a specific value for the dielectric constant of the substrate on which split-ring resonator structures 116A, 116B are formed. Hence, by monitoring the location in frequency of the resonance curves, precise information as to the dielectric properties of the RF substrate and its variations, which is an important factor in the performance of the antennas and RF front end in the overall radar sensor. Also, RF boards 100 are often subjected to different material exposure and fabrication processes, which, according to the technique of the present disclosure, can be quickly and accurately monitored, saving a significant amount of time and effort in troubleshooting of problematic RF boards 100.

Small-sized split-ring resonators such as those described herein can be placed on every RF board and measured according to the technique described herein. It should also be noted that since using VNA measurements to collect scattering parameters, i.e., S parameters, of RF circuitry is a common practice in microwave engineering, utilization of such a setup in the technique of the present disclosure reduces the need for any additional or specialized measurement equipment, which adds efficiency and ease of implementation to the technique described herein. Regarding the calibration process of the present disclosure, only a standard (short-open-broadband load) single-port calibration is required to obtain return loss (S11) plots, such as the plots shown in FIG. 3.

Figure 4A:
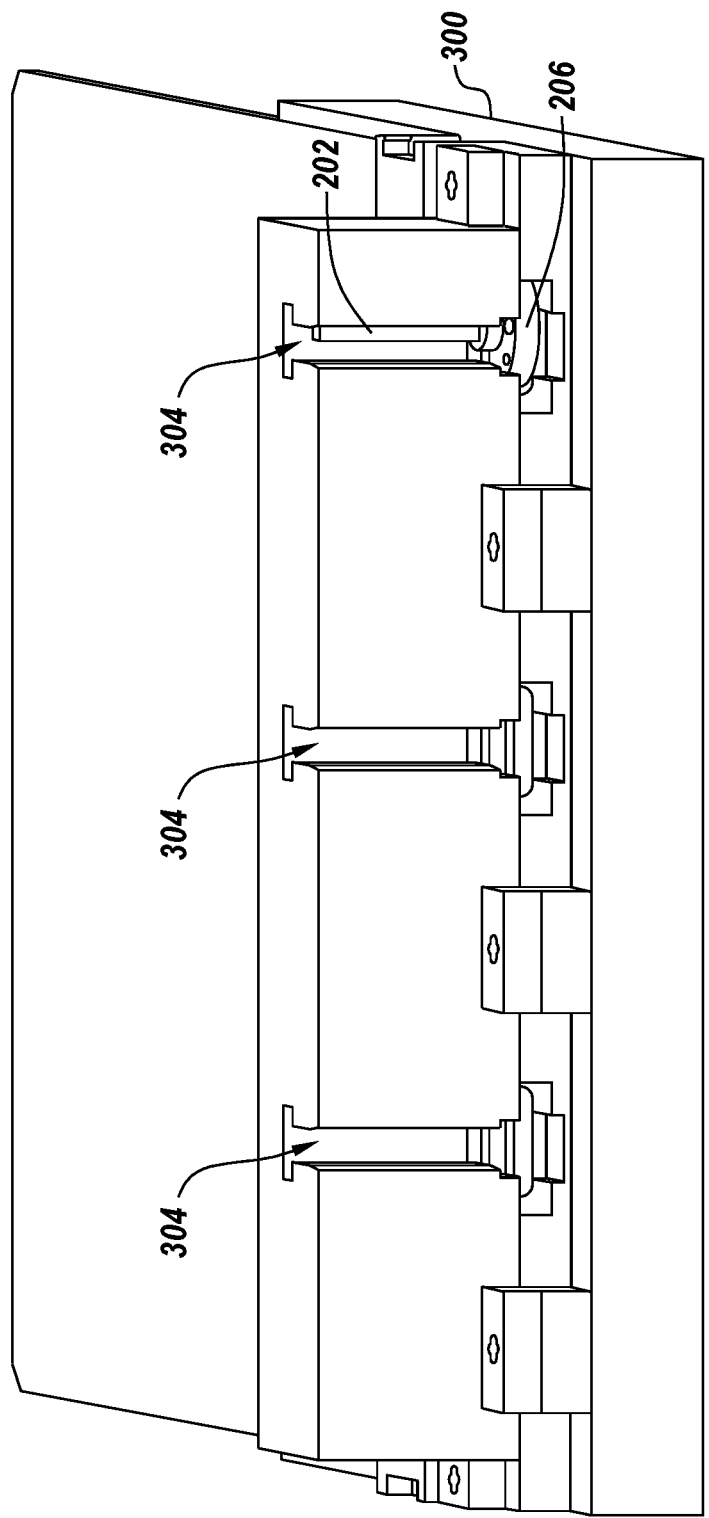
FIG. 4A includes a schematic perspective rear view of a panel measurement fixture for measuring/monitoring dielectric constant of multiple RF boards, according to some exemplary embodiments.
Figure 4B:
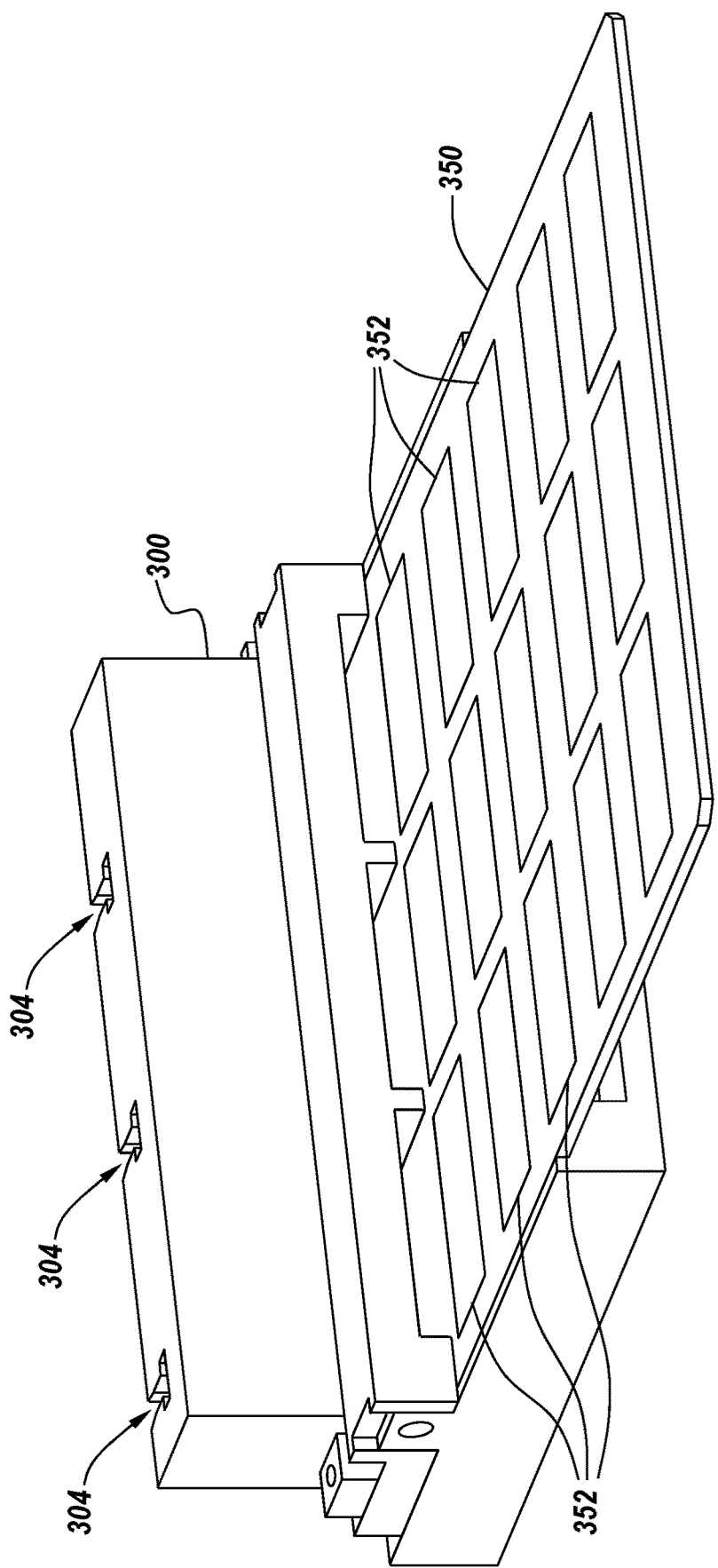
FIG. 4B includes a schematic perspective front view of the panel measurement fixture of FIG. 4A with a multi-board panel positioned in the fixture, according to some exemplary embodiments.
Figure 4C:
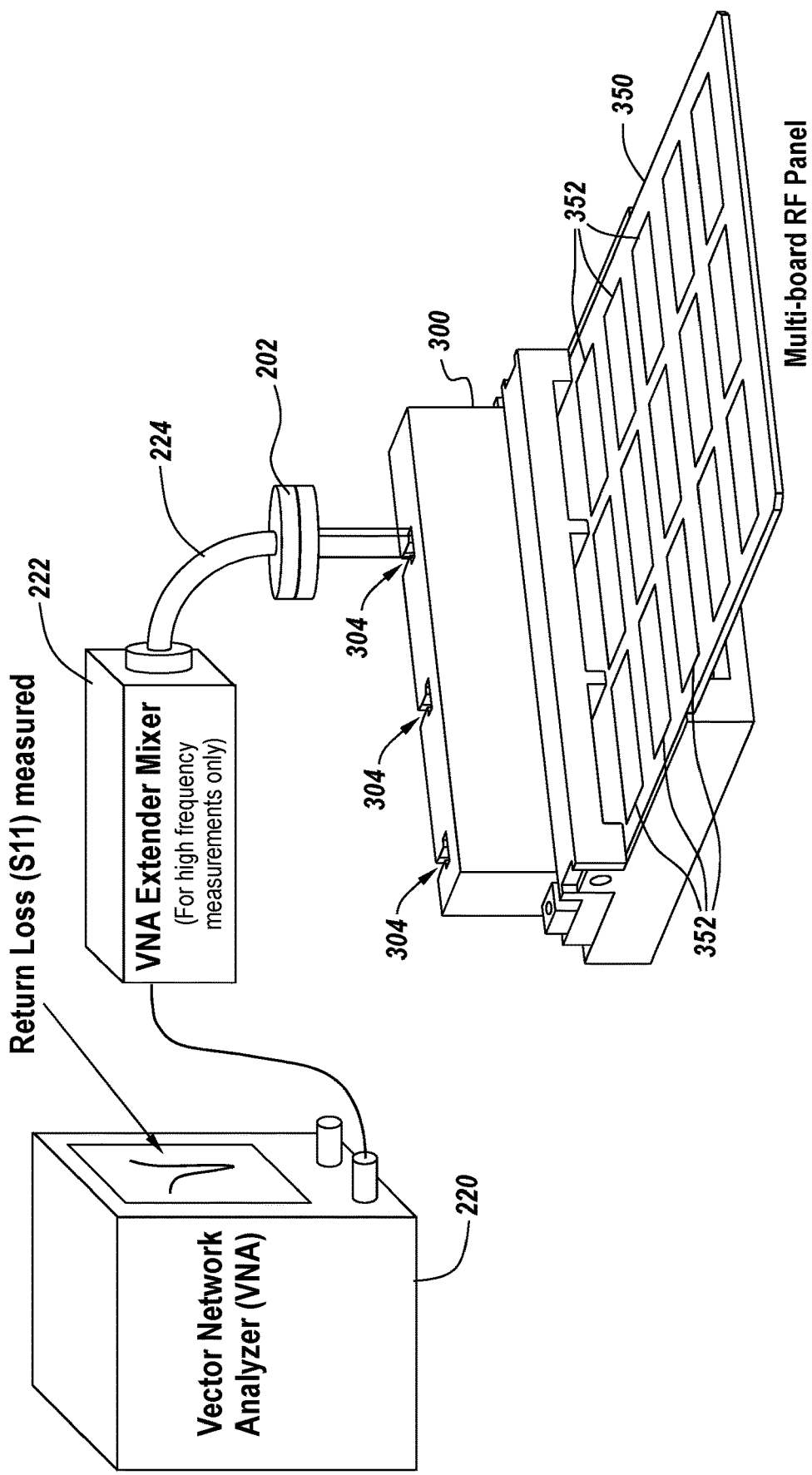
FIG. 4C includes a schematic diagram of a system for measuring/monitoring dielectric constant of multiple RF boards, according to some exemplary embodiments.

The technique of the disclosure has been described thus far herein in the context of a single RF board 100 being processed using a single-board fixture 200. According to the present disclosure, multiple RF boards 100, i.e., manufactured panels, can be mounted in a panel measurement fixture such that multiple RF boards 100 can be processed in a single setup. FIG. 4A includes a schematic perspective rear view of a panel measurement fixture 300 for measuring/monitoring dielectric constant of multiple RF boards, according to some exemplary embodiments. FIG. 4B includes a schematic perspective front view of the panel measurement fixture 300 of FIG. 4A with a multi-board panel 350 positioned in fixture 300, according to some exemplary embodiments. FIG. 4C includes a schematic diagram of a system for measuring/monitoring dielectric constant of multiple RF boards, according to some exemplary embodiments.

Referring to FIGS. 4A through 4C, multi-board RF panel 350 can include multiple, for example, a panel of fifteen, mounting positions 352 at which RF boards 100 can be placed for dielectric constant testing according to the present disclosure. In the particular illustrated exemplary embodiment, RF board mounting positions 352 are disposed in three columns of five rows. Each column can be used as a testing position for a single RF board. Each column has an opening 304 in panel measurement fixture 300 through which waveguide 202 passes to couple VNA 220 to split-ring resonators formed on the RF board. As described above in connection with the single-board testing configuration, fixture 300 maintains a gap between the open end of waveguide 202 and the split-ring resonator structures formed on the RF board being tested. As in the single-board testing configuration, in the multi-board configuration of FIGS. 4A through 4C, at each station being used for testing at a given time, open-ended waveguide 202 passes through opening 304 to couple the testing fixture 300 to VNA 220, via a connecting waveguide 224 and an optional VNA extender mixer 222, used for high-frequency measurements. The dielectric constant measurement is carried out in the same fashion as described above in detail in connection with the single-board configuration.

Testing can be carried out on multiple boards in any desired order. For example, after a test is complete on a first board, multi-board panel 350 can be moved through fixture 300 to position the next RF board in the present column at the opening 304 and waveguide 202. When all boards in a column have been tested, waveguide 202 can be moved to the next fixture station passing through the next opening 304 to test the next column of RF boards.

Whereas many alterations and modifications of the disclosure will become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. A system for monitoring dielectric constant of a substrate, comprising:
a resonator structure formed on a surface of the substrate;
a waveguide having a distal end coupled to the resonator structure and spaced apart from the resonator structure such that a gap is provided between the distal end of the waveguide and the resonator structure, an excitation energy being coupled to the resonator structure out of the waveguide and a response energy from the resonator structure being coupled into the waveguide and being detected at a proximal end of the waveguide;
a detector for detecting the response energy received at the proximal end of the waveguide and generating a signal indicative of the detected response energy; and
a processor coupled to the detector for receiving the signal indicative of the detected response energy and processing the signal to determine dielectric constant of the substrate.

2. The system of claim 1, wherein the waveguide is an open-ended waveguide.

3. The system of claim 1, wherein the detector comprises a network analyzer.

4. The system of claim 1, wherein the detector comprises a vector network analyzer.

5. The system of claim 1, wherein the excitation energy has a nominal frequency of approximately 77 GHz.

6. The system of claim 1, wherein the excitation energy has a frequency in a range of 60 to 90 GHz.

7. The system of claim 1, wherein the excitation energy has a nominal frequency of approximately 24 GHz.

8. The system of claim 1, wherein the processor performs a resonance behavior analysis of return loss patterns received back at the detector to determine dielectric constant of the substrate.

9. The system of claim 1, wherein the resonator structure comprises a split-ring resonator structure.

10. The system of claim 9, wherein the split-ring resonator is tuned to a frequency of the excitation energy.

11. The system of claim 9, wherein a configuration of the split-ring resonator structure is selected based on a desired frequency band and in accordance with material properties of the substrate.

12. The system of claim 9, wherein a location of the split-ring resonator structure on the substrate is selected based on location of at least one electronic component mounted on the substrate.

13. The system of claim 1, wherein the resonator structure comprises a coupon structure.

14. The system of claim 1, wherein the substrate is populated with at least one electronic element.

15. The system of claim 1, wherein the substrate is a bare unpopulated substrate.

16. The system of claim 1, wherein the waveguide is selected based on a desired frequency band.

17. A method for monitoring dielectric constant of a substrate, comprising:
- forming a resonator structure on a surface of the substrate;
- coupling a distal end of a waveguide to the resonator structure, the distal end of the waveguide being spaced apart from the resonator structure such that a gap is provided between the distal end of the waveguide and the resonator structure;
- coupling an excitation energy to the resonator structure out of the distal end of the waveguide;
- detecting a response energy from the resonator structure at a proximal end of the waveguide;
- generating a signal indicative of the detected response energy; and
- processing the signal indicative of the detected response energy to determine dielectric constant of the substrate.

18. The method of claim 17, wherein the detecting is performed at least partially by a vector network analyzer.

19. The method of claim 17, wherein the excitation energy has a frequency in a range of 60 to 90 GHz.

20. The method of claim 1, wherein processing the signal indicative of the detected response energy comprises performing a resonance behavior analysis of return loss patterns received back at the detector to determine dielectric constant of the substrate.

21. A circuit board for use in a radio frequency (RF) system, comprising:
- a substrate; and
- a split-ring resonator structure formed on the substrate, the split-ring resonator structure being adapted to be excited by excitation energy from a distal open end of a waveguide and provide response energy back into the distal open end of the waveguide, the response energy being detectable to provide a measurement of dielectric constant of the substrate when the distal end of the waveguide is located in proximity to the split-ring resonator structure and spaced apart from the split-ring resonator structure and not contacting the split-ring resonator structure.

* * * * *

UNITED STATES PATENT AND TRADEMARK OFFICE
CERTIFICATE OF CORRECTION

PATENT NO. : 10,725,076 B2  
APPLICATION NO. : 16/184331  
DATED : July 28, 2020  
INVENTOR(S) : Majid Ahmadloo Page 1 of 1

It is certified that error appears in the above-identified patent and that said Letters Patent is hereby corrected as shown below:

In the Claims

In Column 10, Line 7 (Claim 20) the portion of the line reading "The method of claim 1," should read --The method of claim 17,--.

Signed and Sealed this  
Twenty-seventh Day of October, 2020

Andrei Iancu  
*Director of the United States Patent and Trademark Office*